(12) United States Patent
Park et al.

(10) Patent No.: US 12,185,647 B2
(45) Date of Patent: Dec. 31, 2024

(54) VARIABLE RESISTANCE MEMORY DEVICE

(71) Applicant: SAMSUNG ELECTRONICS CO., LTD., Suwon-si (KR)

(72) Inventors: Wonjun Park, Suwon-si (KR); Chungman Kim, Suwon-si (KR); Dongho Ahn, Suwon-si (KR); Changyup Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 18/119,970

(22) Filed: Mar. 10, 2023

(65) Prior Publication Data

US 2023/0301218 A1 Sep. 21, 2023

(30) Foreign Application Priority Data

Mar. 21, 2022 (KR) ........................ 10-2022-0034938

(51) Int. Cl.
*G11C 11/00* (2006.01)
*H10B 63/00* (2023.01)
*H10N 70/00* (2023.01)
*H10N 70/20* (2023.01)

(52) U.S. Cl.
CPC ......... *H10N 70/8828* (2023.02); *H10B 63/80* (2023.02); *H10N 70/063* (2023.02); *H10N 70/231* (2023.02); *H10N 70/841* (2023.02)

(58) Field of Classification Search
CPC ............. H10N 70/8828; H10N 70/231; H10N 70/841; H10N 701/063; H10B 63/80
See application file for complete search history.

(56) References Cited

U.S. PATENT DOCUMENTS

| | | | |
|---|---|---|---|
| 7,727,458 B2 | 6/2010 | Ha et al. | |
| 7,834,337 B2 | 11/2010 | Takaura et al. | |
| 8,299,450 B2 | 10/2012 | Ahn et al. | |
| 8,320,170 B2 | 11/2012 | Hwang et al. | |
| 9,614,152 B2 | 4/2017 | Kim | |
| 2008/0073637 A1 | 3/2008 | Kuh et al. | |
| 2010/0171087 A1 | 7/2010 | Kurotsuchi et al. | |
| 2018/0040669 A1* | 2/2018 | Wu ........................ | H10N 70/20 |

(Continued)

FOREIGN PATENT DOCUMENTS

| | | |
|---|---|---|
| CN | 106191773 B | 5/2018 |
| CN | 106374045 B | 9/2018 |

(Continued)

*Primary Examiner* — Min Huang
(74) *Attorney, Agent, or Firm* — Muir Patent Law, PLLC

(57) ABSTRACT

A variable resistance memory device includes a first conductive line extending on a substrate in a first horizontal direction; a second conductive line extending on the first conductive line in a second horizontal direction perpendicular to the first horizontal direction; and a memory cell at an intersection between the first conductive line and the second conductive line, the memory cell including a selection element and a variable resistor, wherein the variable resistor includes a first variable resistance layer having a senary component represented by $C_a Ge_b Sb_c Te_d A_e X_f$, in which A and X are each a group 13 element different from each other, and $1 \leq a \leq 18$, $13 \leq b \leq 26$, $15 \leq c \leq 30$, $35 \leq d \leq 55$, $0.1 \leq e \leq 8$, $0.1 \leq f \leq 8$, and $a+b+c+d+e+f=100$.

20 Claims, 15 Drawing Sheets

(56) References Cited

U.S. PATENT DOCUMENTS

| | | | |
|---|---|---|---|
| 2020/0365801 A1* | 11/2020 | Yu | H10N 70/026 |
| 2021/0193922 A1* | 6/2021 | Lee | H10B 63/20 |
| 2022/0013722 A1* | 1/2022 | Jung | H10B 63/24 |
| 2022/0320430 A1* | 10/2022 | Zhang | H10N 70/24 |

FOREIGN PATENT DOCUMENTS

| | | |
|---|---|---|
| JP | 2020-132996 A | 8/2020 |
| KR | 10-0829601 B1 | 5/2008 |

* cited by examiner

VARIABLE RESISTANCE MEMORY DEVICE

CROSS-REFERENCE TO RELATED APPLICATION

This application is based on and claims priority under 35 U.S.C. § 119 to Korean Patent Application No. 10-2022-0034938, filed on Mar. 21, 2022, in the Korean Intellectual Property Office, the disclosure of which is incorporated by reference herein in its entirety.

BACKGROUND

1. Field

Embodiments relate to a variable resistance memory device.

2. Description of the Related Art

In accordance with a high speed and low power of an electronic product, read/write operations of a semiconductor device mounted in the electronic product may have high speeds and an operating voltage thereof may be low. A highly integrated variable resistance memory device may perform high speed read and write operations and may be non-volatile, and the highly integrated variable resistance memory device is rising as a next-generation memory device.

SUMMARY

The embodiments may be realized by providing a variable resistance memory device including a first conductive line extending on a substrate in a first horizontal direction; a second conductive line extending on the first conductive line in a second horizontal direction perpendicular to the first horizontal direction; and a memory cell at an intersection between the first conductive line and the second conductive line, the memory cell including a selection element and a variable resistor, wherein the variable resistor includes a first variable resistance layer having a senary component represented by $C_aGe_bSb_cTe_dA_eX_f$, in which A and X are each a group 13 element different from each other, and $1 \leq a \leq 18$, $13 \leq b \leq 26$, $15 \leq c \leq 30$, $35 \leq d \leq 55$, $0.1 \leq e \leq 8$, $0.1 \leq f \leq 8$, and $a+b+c+d+e+f=100$.

The embodiments may be realized by providing a variable resistance memory device including a first conductive line extending on a substrate in a first horizontal direction; a second conductive line extending on the first conductive line in a second horizontal direction perpendicular to the first horizontal direction; and a memory cell at an intersection between the first conductive line and the second conductive line, the memory cell including a selection element and a variable resistor, wherein the variable resistor includes a first variable resistance layer having a senary component including carbon, A, and X, in which, A and X are each a group 13 element different from each other, and a second variable resistance layer on the first variable resistance layer, the second variable resistance layer including a ternary component including germanium (Ge), antimony (Sb), and tellurium (Te).

The embodiments may be realized by providing a variable resistance memory device including a first conductive line extending on a substrate in a first horizontal direction; a second conductive line extending on the first conductive line in a second horizontal direction intersecting with the first horizontal direction; a memory cell at an intersection between the first conductive line and the second conductive line, the memory cell including a selection element and a variable resistor; a lower electrode contacting a top surface of the first conductive line; and an upper electrode contacting a bottom surface of the second conductive line, wherein the variable resistor includes a first variable resistance layer having a senary component represented by $C_aGe_bSb_cTe_dA_eX_f$, in which A and X are each a group 13 element different from each other and $1 \leq a \leq 18$, $13 \leq b \leq 26$, $15 \leq c \leq 30$, $35 \leq d \leq 55$, $0.1 \leq e \leq 8$, $0.1 \leq f \leq 8$, and $a+b+c+d+e+f=100$.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
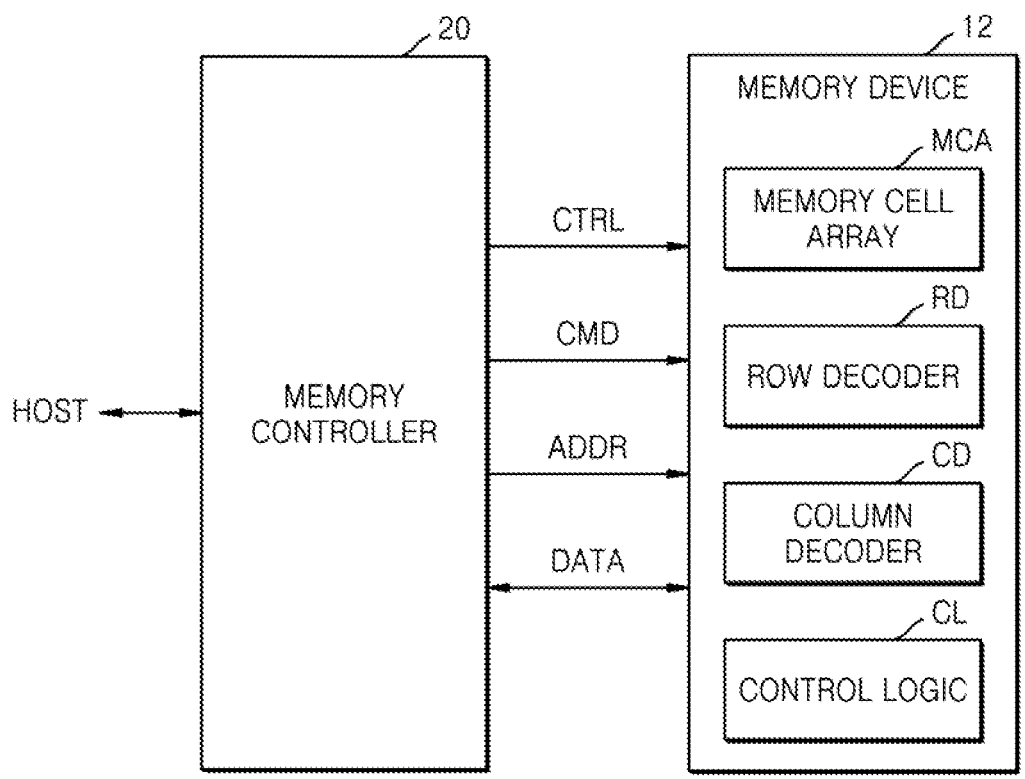
FIG. 1 is a block diagram illustrating a memory system including a variable resistance memory device according to an embodiment.

FIG. 1 is a block diagram illustrating a memory system 10 including a variable resistance memory device according to an embodiment.

Referring to FIG. 1, the memory system 10 may include a memory device 12 and a memory controller 20. The memory device 12 may include a memory cell array MCA, a row decoder RD, a column decoder CD, and a control logic CL.

The memory controller 20 may control the memory device 12 to read data stored in the memory device 12 or to write data in the memory device 12 in response to a write/read request from a host HOST. The memory controller 20 may provide an address ADDR, a command CMD, and a control signal CTRL to the memory device 12, and thus, may control a program (or write) operation, a read operation, and an erase operation. In addition, data DATA to be written and read data DATA may be transmitted and received between the memory controller 20 and the memory device 12.

The memory cell array MCA may include a plurality of memory cells (e.g., a plurality of memory cells MC illustrated in FIG. 3) respectively arranged in a plurality of regions formed by intersections of a plurality of first signal lines and a plurality of second signal lines. In an implementation, the plurality of first signal lines may include a plurality of bit lines and the plurality of second signal lines may include a plurality of word lines. In an implementation, the plurality of first signal lines may include a plurality of word lines and the plurality of second signal lines may include a plurality of bit lines.

Each of the plurality of memory cells may include a single level cell (SLC) storing data of one bit, a multi-level cell (MLC) storing data of two or more bits, or a combination thereof.

Figure 3:
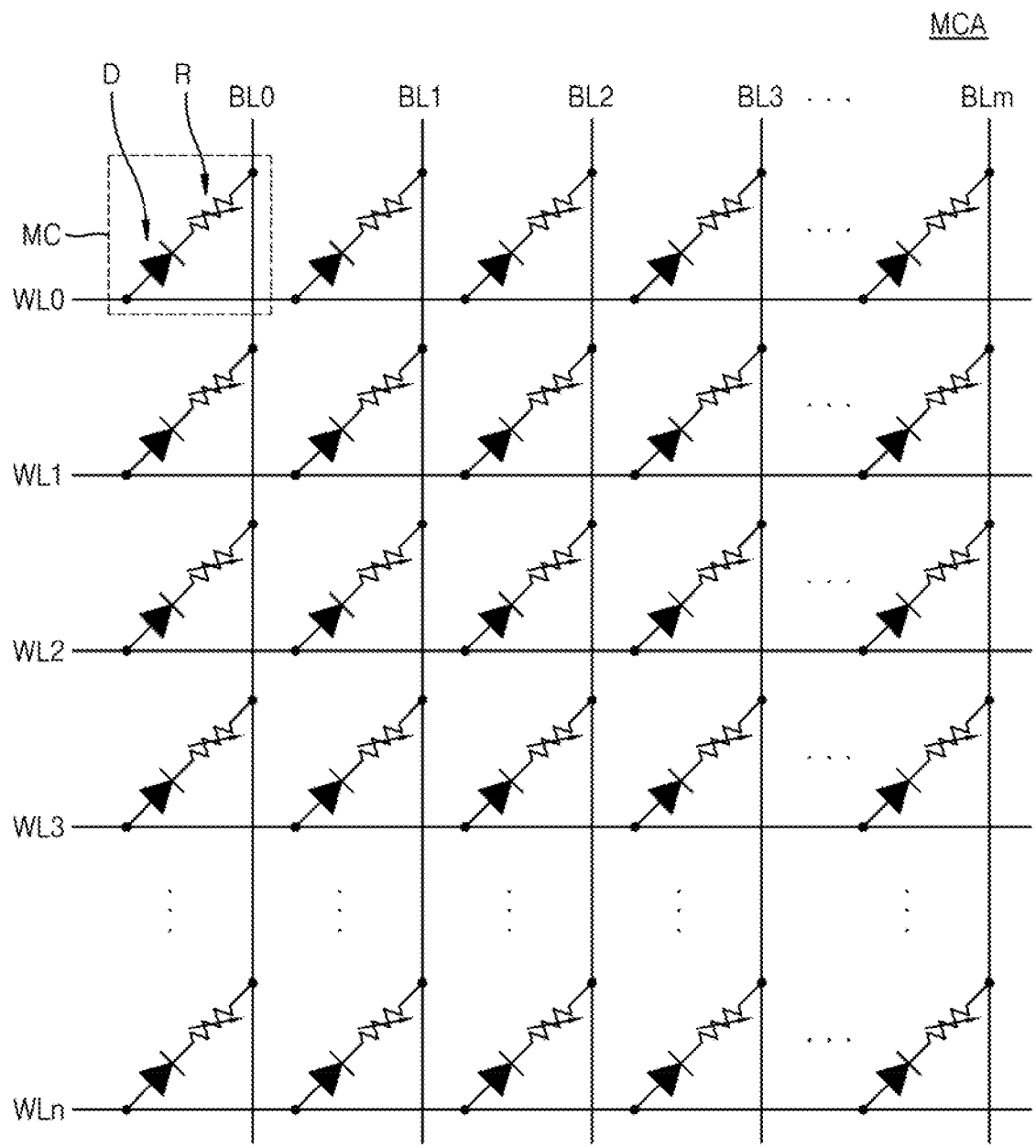
FIG. 3 is a circuit diagram illustrating an implementation example of the memory cell array illustrated in FIG. 2.

The memory cell array MCA may include the plurality of memory cells each including a variable resistance device, e.g., a variable resistor R illustrated in FIG. 3. In an implementation, when the variable resistor R includes a phase change material in which a resistance thereof is changed by heating and cooling, the memory device 12 may include a phase-change random access memory (PRAM) device.

The row decoder RD may drive the plurality of word lines configuring the memory cell array MCA and the column decoder CD may drive the plurality of bit lines configuring the memory cell array MCA. The row decoder RD may include a decoding unit decoding a row address and a switch unit in which switching is controlled in response to various row control signals based on a decoding result. The column decoder CD may include a decoding unit decoding a column address and a switching unit in which switching is controlled in response to various column control signals based on a decoding result.

The control logic CL may control an overall operation of the memory device 12 and may control the row decoder RD and the column decoder CD in order to perform an operation of selecting a memory cell from the memory cell array MCA. In an implementation, the control logic CL may generate the row address and the column address by processing an address from the outside. The memory device 12 may include a power generator generating various write voltages and read voltages used for a write operation and a read operation, and based on control by the control logic CL, a write voltage and a read voltage may be provided to a memory cell through the row decoder RD and the column decoder CD.

Figure 2:
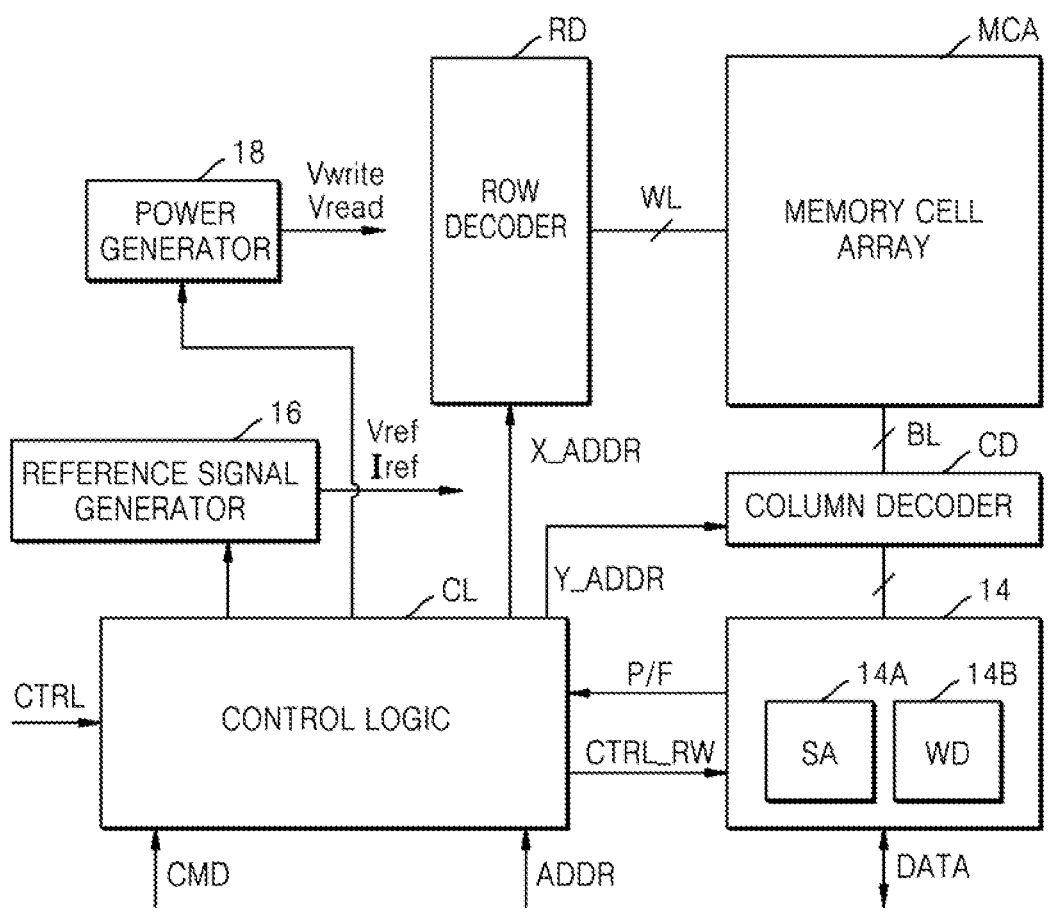
FIG. 2 is a block diagram illustrating a configuration of the memory device illustrated in FIG. 1.

FIG. 2 is a block diagram illustrating a configuration of the memory device 12 illustrated in FIG. 1.

Referring to FIG. 2, the memory device 12 may include the memory cell array MCA, the row decoder RD, the column decoder CD, and the control logic CL. In an implementation, the memory device 12 may further include a write/read circuit 14, a reference signal generator 16, and a power generator 18. The write/read circuit 14 may include a sense amplifier 14A and a write driver 14B.

A plurality of memory cells included in the memory cell array MCA may be connected to a plurality of word lines WL and a plurality of bit lines BL. Various voltage or current signals may be provided through the plurality of word lines WL and the plurality of bit lines BL so that data may be written in or read from selected memory cells and data may be prevented from being written in or read from the remaining unselected memory cells.

The control logic CL may receive an address ADDR for indicating a memory cell to be accessed, based on a command CMD. The address ADDR may include a row address X_ADDR for selecting a word line WL of the memory cell array MCA and a column address Y_ADDR for selecting a bit line BL of the memory cell array MCA. The row decoder RD may perform a word line selection operation in response to the row address X_ADDR and the column decoder CD may perform a bit line selection operation in response to the column address Y_ADDR.

The write/read circuit 14 may be connected to the bit line BL and may write data in a memory cell or may read data from the memory cell.

The power generator 18 may generate a write voltage Vwrite used for the write operation and a read voltage Vread used for the read operation. The write voltage Vwrite may include a set voltage and a reset voltage. The write voltage Vwrite and the read voltage Vread may be provided to the bit line BL through the column decoder CD or may be provided to the word line WL through the row decoder RD.

The reference signal generator 16 may generate a reference voltage Vref and a reference current Iref as various reference signals related to the data read operation.

In the write/read circuit 14, the sense amplifier 14A may be connected to a sensing node of the bit line BL to determine the data by using the reference voltage Vref or the reference current Iref. The write/read circuit 14 may provide a pass/fail signal P/F in accordance with a result of determining the read data to the control logic CL. The control logic CL may control the write and read operations of the memory cell array MCA with reference to the pass/fail signal P/F.

The control logic CL may output various control signals CTRL_RW for writing data in the memory cell array MCA or reading data from the memory cell array MCA based on the address ADDR, the command CMD, and the control signal CTRL received from the memory controller 20 (refer to FIG. 1).

FIG. 3 is a circuit diagram illustrating an implementation example of the memory cell array MCA illustrated in FIG. 2.

Referring to FIG. 3, the memory cell array MCA may include a plurality of cell areas, and FIG. 3 may represent one of the plurality of cell areas.

The memory cell array MCA may include a plurality of word lines WL0, WL1, . . . , and WLn (in which n is an integer of 2 or more), a plurality of bit lines BL0, BL1, . . . , and BLm (in which m is an integer of 2 or more), and a plurality of memory cells MC.

The plurality of word lines WL0, WL1, . . . , and WLn may correspond to the word line WL of FIG. 2, and the plurality of bit lines BL0, BL1, . . . , and BLm may correspond to the bit line BL of FIG. 2. The plurality of memory cells MC may be arranged at intersection points between the plurality of word lines WL0, WL1, . . . , and WLn and the plurality of bit lines BL0, BL1, . . . , and BLm. The number of word lines WL, the number of bit lines BL, and the number of memory cells MC may be variously changed according to embodiments.

In an implementation, each of the plurality of memory cells MC may include a variable resistor R for storing information and a selection device or selection element D for selecting a memory cell. The selection element D may be electrically connected to one of the plurality of word lines WL0, WL1, . . . , and WLn, the variable resistor R may be electrically connected to one of the plurality of bit lines BL0, BL1, . . . , and BLm, and the variable resistor R may be serially connected to the selection element D. In an implementation, the variable resistor R may be connected to a word line, and the selection element D may be connected to a bit line.

In order to drive a memory device 12 (refer to FIG. 2), a voltage may be applied to the variable resistor R of the memory cell MC through the plurality of word lines WL0, WL1, ..., and WLn and the plurality of bit lines BL0, BL1, ..., and BLm, and thus, a current may flow in the variable resistor R. The variable resistor R may be changed to one of a plurality of resistance states by an electrical pulse applied thereto. In embodiments, the variable resistor R may include a phase change material in which a crystal state thereof is changed based on the amount of current. The phase change material may be changed to an amorphous state in which a resistance is relatively high, or a crystal state in which a resistance is relatively low. A phase of the phase change material may be changed by Joule heat which is generated based on the amount of current, and data may be written or erased by using a phase change.

An arbitrary memory cell MC may be selected by selecting one from the plurality of word lines WL0, WL1, ..., and WLn and one from the plurality of bit lines BL0, BL1, ..., and BLm, and by applying a predetermined signal between the selected word line and the selected bit line, the memory cell MC may be programmed. In addition, by measuring a current value through the plurality of bit lines BL0, BL1, ... and BLm, information, e.g., programmed information based on a resistance value of a resistive memory pattern of a corresponding memory cell MC may be read.

Figure 4:
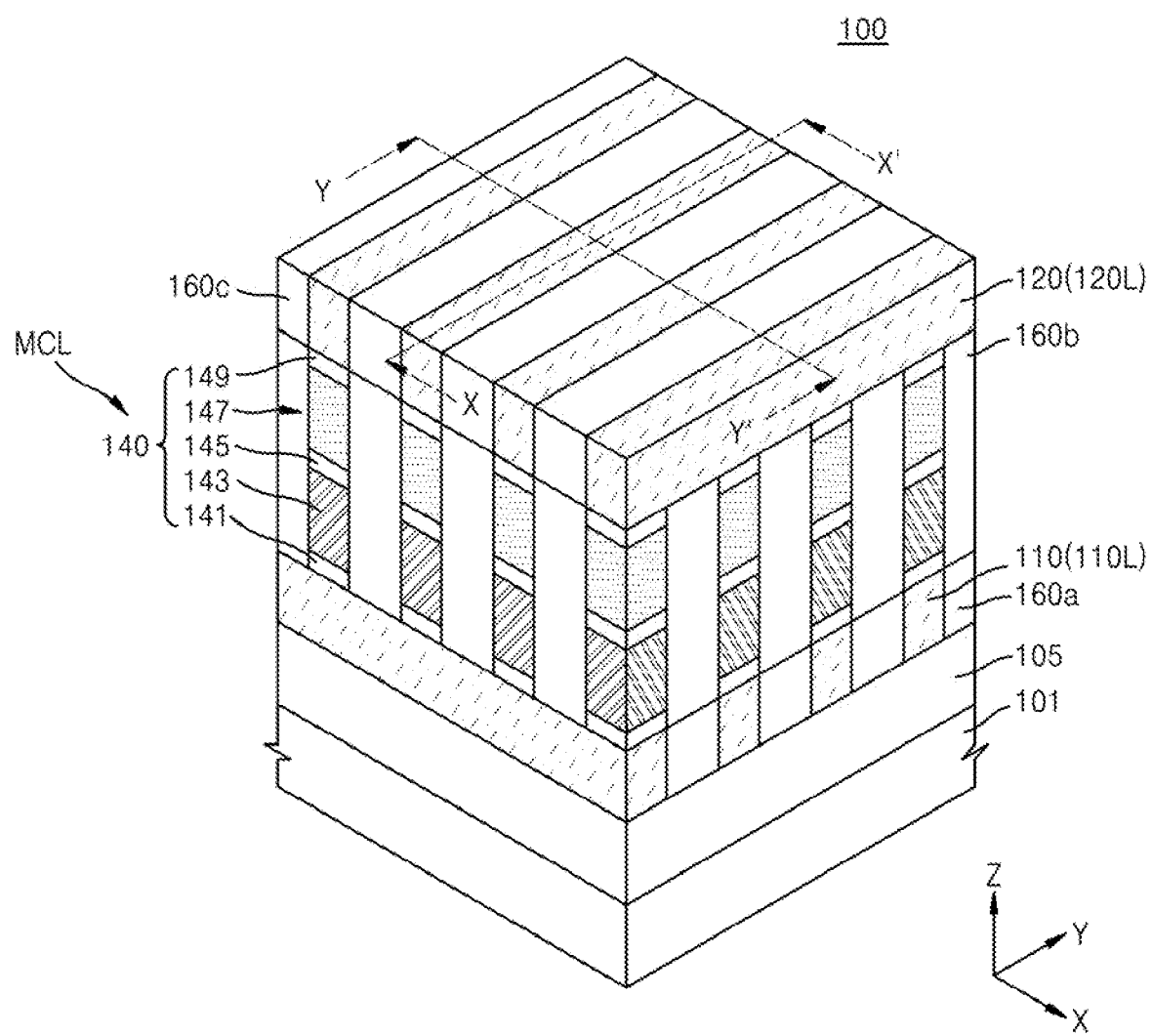
FIG. 4 is a perspective view illustrating a variable resistance memory device according to an embodiment.
Figure 5:
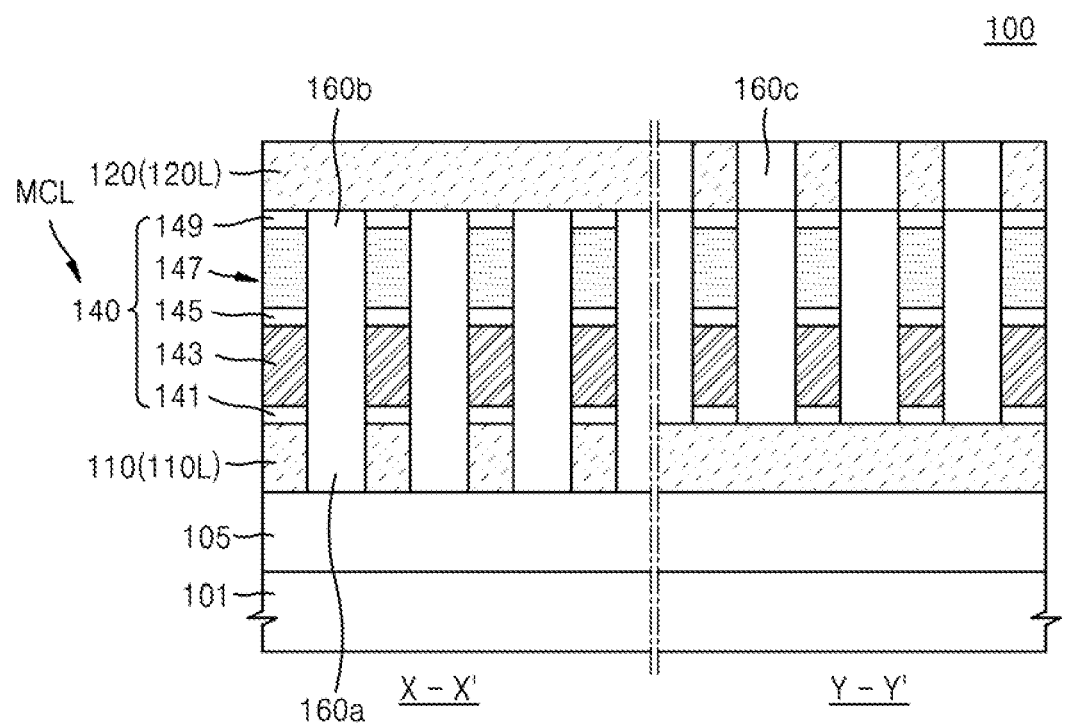
FIG. 5 is a cross-sectional view taken along the lines X-X' and Y-Y' of FIG. 4.

FIG. 4 is a perspective view illustrating a variable resistance memory device 100 according to an embodiment and FIG. 5 is a cross-sectional view taken along the lines X-X' and Y-Y' of FIG. 4.

Referring to FIGS. 4 and 5, the variable resistance memory device 100 may include a first conductive line layer 110L, a second conductive line layer 120L, and a memory cell layer MCL on a substrate 101.

An interlayer insulating layer 105 may be on the substrate 101. The interlayer insulating layer 105 may include silicon oxide or silicon nitride and may electrically isolate the first conductive line layer 110L from the substrate 101. In an implementation, in the variable resistance memory device 100 according to the current embodiment, the interlayer insulating layer 105 may be on the substrate 101. In an implementation, in the variable resistance memory device 100 according to the current embodiment, an integrated circuit layer may be on the substrate 101 and the first conductive line layer 110L, the second conductive line layer 120L, and the memory cell layer MCL may be on the integrated circuit layer. In an implementation, the integrated circuit layer may include a peripheral circuit for operations of the memory cell layer MCL and/or a core circuit for operations.

The first conductive line layer 110L may include a plurality of first conductive lines 110 extending in parallel in a first horizontal direction (an X direction). The second conductive line layer 120L may include a plurality of second conductive lines 120 extending in parallel in a second horizontal direction (a Y direction) intersecting with the first horizontal direction (the X direction). The first horizontal direction (the X direction) may vertically intersect with the second horizontal direction (the Y direction).

In driving the variable resistance memory device 100, the plurality of first conductive lines 110 may respectively correspond to the word lines WL (refer to FIG. 1) and the plurality of second conductive lines 120 may respectively correspond to the bit lines BL (refer to FIG. 1). On the contrary, the plurality of first conductive lines 110 may respectively correspond to the bit lines BL (refer to FIG. 1) and the plurality of second conductive lines 120 may respectively correspond to the word lines WL (refer to FIG. 1).

Each of the plurality of first conductive lines 110 and the plurality of second conductive lines 120 may include a metal, conductive metal nitride, conductive metal oxide, or a combination of the above metals. In an implementation, each of the plurality of first conductive lines 110 and the plurality of second conductive lines 120 may independently include, e.g., tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In an implementation, each of the plurality of first conductive lines 110 and the plurality of second conductive lines 120 may independently include a metal layer and a conductive barrier layer covering at least a part of the metal layer. The conductive barrier layer may include, e.g., titanium (Ti), titanium nitride (TiN), tantalum (Ta), tantalum nitride (TaN), or a combination of the above metals. As used herein, the term "or" is not an exclusive term, e.g., "A or B" would include A, B, or A and B. As used herein, the terms "first," "second," and the like are merely for identification and differentiation, and are not intended to imply or require sequential inclusion (e.g., a third element and a fourth element may be described without implying or requiring the presence of a first element or second element).

The memory cell layer MCL may include a plurality of memory cells 140 apart from one another in the first horizontal direction (the X direction) and in the second horizontal direction (the Y direction). As illustrated in FIG. 4, the plurality of first conductive lines 110 may intersect with the plurality of second conductive lines 120. The plurality of memory cells 140 may be at intersections between the plurality of first conductive lines 110 and the plurality of second conductive lines 120 between the first conductive line layer 110L and the second conductive line layer 120L.

In an implementation, the plurality of memory cells 140 may be square pillar-shaped. In an implementation, each of the plurality of memory cells 140 may be one of various pillar shapes, e.g., cylindrical, elliptical, or polygonal. In an implementation, in accordance with a forming method, a lower portion of each of the plurality of memory cells 140 may be wider than an upper portion thereof or an upper portion of each of the plurality of memory cells 140 may be wider than a lower portion thereof. In an implementation, when each of the plurality of memory cells 140 is formed by an embossed etching process, the lower portion thereof may be wider than the upper portion thereof. In an implementation, when each of the plurality of memory cells 140 is formed by a damascene process, the upper portion thereof may be wider than the lower portion thereof. In the embossed etching process or the damascene process, by precisely controlling etching to etch material layers so that side walls of each of the plurality of memory cells 140 are almost perpendicular, there may be almost no difference between a width of the upper portion of each of the plurality of memory cells 140 and a width of the lower portion thereof. In all the drawings hereinafter, including FIGS. 4 and 5, for convenience sake, the side walls of each of the plurality of memory cells 140 are illustrated as being almost perpendicular. In an implementation, the lower portion of each of the plurality of memory cells 140 may be wider than the upper portion thereof or the upper portion of each of the plurality of memory cells 140 may be wider than the lower portion thereof.

Each of the plurality of memory cells 140 may include a lower electrode layer 141, a selection element layer 143, an intermediate electrode layer 145, a variable resistor 147, and an upper electrode layer 149. When a positional relationship is not considered, the lower electrode layer 141, the intermediate electrode layer 145, and the upper electrode layer 149 may be respectively referred to as a first electrode layer, a second electrode layer, and a third electrode layer.

The variable resistor 147 may include a phase change material that reversibly transits to an amorphous state or a crystalline state in accordance with a heating time. In an implementation, the variable resistor 147 may include a material of which a phase may reversibly change by Joule heat occurring due to a voltage applied to both ends thereof and of which resistance may change by such a phase change. In an implementation, the phase change material may be in a high resistance state in the amorphous state and may be in a low resistance state in the crystalline state. By defining the high resistance state as '0' and the low resistance state as '1', data may be stored in the variable resistor 147.

Figure 6A:
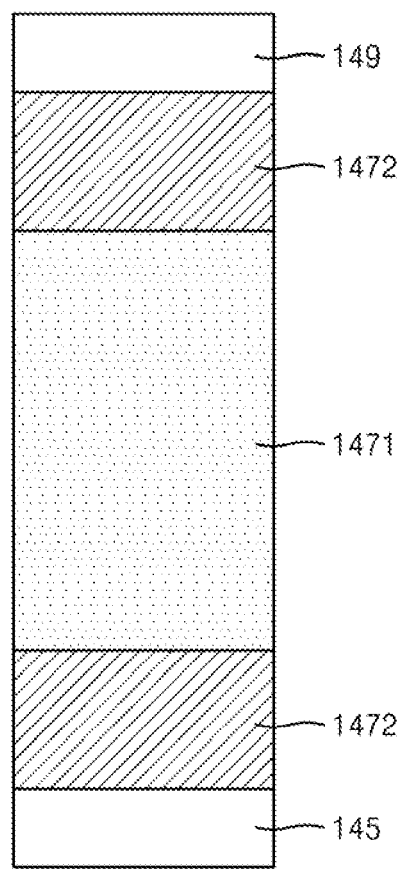
FIGS. 6A to 6C illustrate a variable resistor according to embodiments.

In the variable resistance memory device 100 according to an embodiment, the variable resistor 147 may include a first variable resistance layer 1471 (see, e.g., FIG. 6A).

The first variable resistance layer 1471 may include, e.g., a senary component represented by $C_aGe_bSb_cTe_dA_eX_f$. In an implementation, A and X may each be a group 13 element different from each other and $1 \le a \le 18$, $13 \le b \le 26$, $15 \le c \le 30$, $35 \le d \le 55$, $0.1 e \le 8$, $0.1 \le f \le 8$, and $a+b+c+d+e+f=100$.

In an implementation, each of A and X may include, e.g., boron (B), aluminum (Al), gallium (Ga), indium (In), or thallium (Tl). In an implementation, A may include In and X may include B, Al, Ga, or Tl. In an implementation, A may include Ga and X may include B, Al, In, or Tl. In an implementation, A may include B and X may include Al, Ga, In, or Tl. In an implementation, A may include In and X may include Al.

In an implementation, the first variable resistance layer 1471 may include a senary component represented by $C_aGe_bSb_cTe_dA_eX_f$. In an implementation, a may have an arbitrary at % range defined by a starting point and an end point selected from 1, 2, 3, 4, 5, 6, 7, 8, 9, 10, 12, 13, 14, 14, 15, 16, 17, and 18. b may have an arbitrary at % range defined by a starting point and an end point selected from 13, 14, 15, 16, 17, 18, 19, 20, 21, 22, 23, 24, 25, and 26. c may have an arbitrary at % range defined by a starting point and an end point selected from 15, 16, 17, 18, 19, 20, 21, 22, 23, 24, 25, 26, 27, 28, 29, and 30. d may have an arbitrary at % range defined by a starting point and an end point selected from 35, 36, 37, 38, 39, 40, 41, 42, 43, 44, 45, 46, 47, 48, 49, 50, 51, 52, 53, 54, and 55.

Each of e and f may have an arbitrary at % range defined by a starting point and an end point selected from 0.1, 0.2, 0.3, 0.4, 0.5, 0.6, 0.7, 0.8, 0.9, 1, 1.5, 2, 2.5, 3, 3.5, 4, 4.5, 5, 5.5, 6, 6.5, 7, 7.5, and 8. In an implementation, f may have a range of $0.4 \le f \le 8$, $0.5 \le f \le 8$, $0.6 \le f \le 7.5$, $0.7 \le f \le 7$, $0.8 \le f \le 6.5$, $1 \le f \le 6$, $1.5 \le f \le 5$, or $2 \le f \le 4$. In an implementation, e may have a range of $0.4 \le e \le 8$, $0.5 \le e \le 8$, $0.6 \le e \le 7.5$, $0.7 \le e \le 7$, $0.8 \le e \le 6.5$, $1 \le e \le 6$, $1.5 \le e \le 5$, or $2 \le e \le 4$.

The variable resistor 147 including the first variable resistance layer 1471 that includes the senary component, which is described above, may have high thermal stability. When the variable resistor 147 is used, a voltage margin capable of distinguishing states of the respective variable resistance memory devices from one another may be sufficiently secured. In an implementation, a difference $\Delta V_{th}$ in threshold voltage between when the variable resistor 147 is in a reset state (e.g., an amorphous state) and when the variable resistor 147 is in a set state (e.g., a crystalline state) may be greater than when a variable resistor of another composition is used. In an implementation, the reset state may be more clearly distinguished from the set state.

The variable resistor 147 may include two or more variable resistance layers and each element that forms each variable resistance layer may have various stoichiometries. In accordance with stoichiometry of each element, a crystallization temperature, a melting point, a phase change rate in accordance with crystalline energy, and information retention may be controlled. A specific embodiment in which the variable resistor 147 includes a plurality of variable resistance layers will be described in more detail below.

The selection element layer 143 may include a current regulating layer that may control a current flow. The selection element layer 143 may include a material layer of which resistance may vary in accordance with a magnitude of a voltage applied to both ends of the selection element layer 143.

The selection element layer 143 may include an ovonic threshold switching (OTS) material. Simply describing a function of the selection element layer 143 based on the OTS material, when a voltage less than a threshold voltage Vt is applied to the selection element layer 143, the selection element layer 143 may maintain the high resistance state in which little current flows. When a voltage greater than the threshold voltage Vt is applied to the selection element layer 143, the selection element layer 143 may be in the low resistance state so that a current starts to flow. In an implementation, when the current flowing through the selection element layer 143 is less than a holding current, the selection element layer 143 may be transited to the high resistance state.

The OTS material may include a chalcogenide switching material. In an implementation, the selection element layer 143 may include a single layer or a multilayer including, e.g., a two-component materials such as GeSe, GeS, AsSe, AsTe, AsS, SiTe, SiSe, SiS, GeAs, SiAs, SnSe, or SnTe, a three-component material such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe, a four-component material such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn, a five-component material such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn, or a six-component material such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSi- AsSeالسTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTel, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTi, GeAsSeSInZn, GeAsSeSInSn, GeAsSeSGaAl, GeAsSeSGaTi, GeAsSeSGaZn, GeAsSeSGaSn, or GeAsSeSAlSn.

In an implementation, the selection element layer 143 may include one of the above-described two to six-component materials, and at least one additional element, e.g., boron (B), carbon (C), nitrogen (N), or oxygen (O).

Each of the lower electrode layer 141, the intermediate electrode layer 145, and the upper electrode layer 149 functioning as a current path may be formed of a conductive material. In an implementation, each of the lower electrode layer 141, the intermediate electrode layer 145, and the upper electrode layer 149 may include metal, conductive metal nitride, conductive metal oxide, or a combination of the above metals. In an implementation, each of the lower electrode layer 141, the intermediate electrode layer 145, and the upper electrode layer 149 may include, e.g., titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), or tungsten nitride (WN).

In an implementation, the lower electrode layer 141 and the upper electrode layer 149 may be included. In an implementation, the lower electrode layer 141 or the upper electrode layer 149 may be omitted. In order to help prevent contamination or contact failure that may occur as the selection element layer 143 and the variable resistor 147 directly contact the first conductive line 110 and the second conductive line 120, the lower electrode layer 141 and the upper electrode layer 149 may be provided. In an implementation, the lower electrode layer 141 may be between the first conductive line 110 and the selection element layer 143. In this case, a top surface of the first conductive line 110 may contact a lower electrode of the lower electrode layer 141. In an implementation, the upper electrode layer 149 may be between the second conductive line 120 and the variable resistor 147. In this case, a bottom surface of the second conductive line 120 may contact an upper electrode of the upper electrode layer 149.

A first insulating layer 160a may be arranged among or between the plurality of first conductive lines 110, and a second insulating layer 160b may be between the plurality of memory cells 140 of the memory cell layer MCL. In an implementation, a third insulating layer 160c may be between the plurality of second conductive lines 120. The first to third insulating layers 160a to 160c may include the same material or at least one of the first to third insulating layers 160a to 160c may include a different material. Each of the first to third insulating layers 160a to 160c may include, e.g., a dielectric material of silicon oxide or silicon nitride and may electrically isolate elements of each layer from one another. In an implementation, an air gap may be formed instead of a second insulating layer 160b. When the air gap is formed, an insulating liner having a predetermined thickness may be between the air gap and the memory cell 140.

Figure 6B:
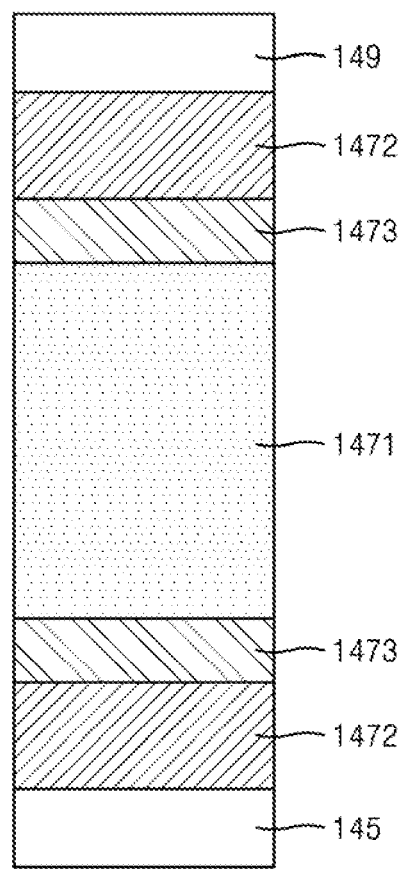
Figure 6C:
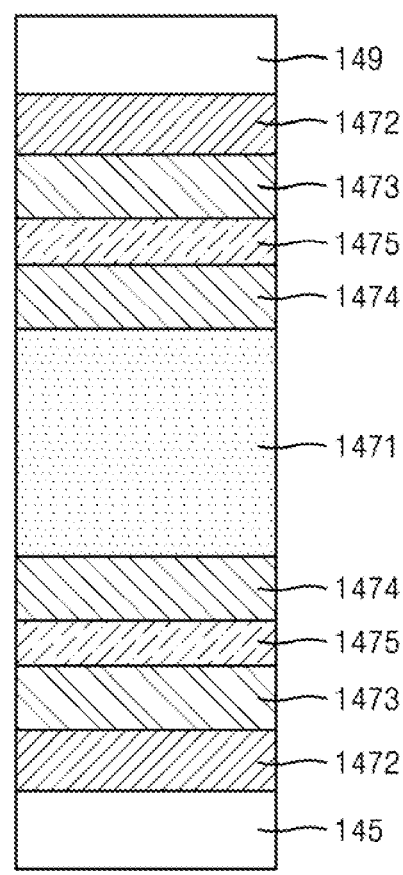

FIGS. 6A to 6C illustrate a variable resistor 147 according to embodiments.

Referring to FIG. 6A, the variable resistor 147 may further include a second variable resistance layer 1472 on the first variable resistance layer 1471. In an implementation, the variable resistor 147 may have a symmetrical structure centered on the first variable resistance layer 1471.

In an implementation, the second variable resistance layer 1472 may include a ternary component, e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, NdSbS, CGeTe, CGeSe, CGeS, CSbSe, CSbTe, CSbS, CSbSe, CSnSb, CInSe, CInSb, CAsTe, CAlTe, CGaSb, CAlSb, CBiSb, CScSb, CYSb, CCeSb, CDySb, or CNdSb.

When the second variable resistance layer 1472 is provided, ΔVTH may be greater than when only the first variable resistance layer 1471 is provided.

Referring to FIG. 6B, the variable resistor 147 may further include a second variable resistance layer 1472 and a third variable resistance layer 1473 on the first variable resistance layer 1471. In an implementation, the third variable resistance layer 1473 may be between the first variable resistance layer 1471 and the second variable resistance layer 1472. In an implementation, the second variable resistance layer 1472 may be between the first variable resistance layer 1471 and the third variable resistance layer 1473. In an implementation, the variable resistor 147 may have a symmetrical structure centered on the first variable resistance layer 1471.

The composition of the second variable resistance layer 1472 is described above, and a repeated description thereof will not be given.

In an implementation, the third variable resistance layer 1473 may include a quaternary component, e.g., CGeSbSe, CAlSbTe, CAlSbSe, CSiSbSe, CSiSbTe, CGeSeTe, CInGeTe, CGeSbTe, CGeAsTe, CSnSeTe, CGeGaSe, CBiSbSe, CGaSeTe, CInGeSb, CGaSbSe, CGaSbTe, CInSbSe, CInSbTe, CSnSbSe, CSnSbTe, CScSbTe, CScSbSe, CScSbS, CYSbTe, CYSbSe, CYSbS, CCeSbTe, CCeSbSe, CCeSbS, CDySbTe, CDySbSe, CDySbS, CNdSbTe, CNdSbSe, CNdSbS, GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS.

When the third variable resistance layer 1473 is provided, ΔVth may be greater than when only the first variable resistance layer 1471 and the second variable resistance layer 1472 are provided.

Referring to FIG. 6C, the variable resistor 147 may further include a second variable resistance layer 1472, a third variable resistance layer 1473, and a fourth variable resistance layer 1474 on the first variable resistance layer 1471. In an implementation, the fourth variable resistance layer 1474 may be between the first variable resistance layer 1471 and the third variable resistance layer 1473. In an implementation, the second variable resistance layer 1472 may be between the third variable resistance layer 1473 and the upper electrode layer 149. In an implementation, the variable resistor 147 may have a symmetrical structure centered on the first variable resistance layer 1471.

The compositions of the second variable resistance layer 1472 and the third variable resistance layer 1473 are described above, and a description thereof will not be given again. In an implementation, the fourth variable resistance layer 1474 may include, e.g., a quaternary component like the third variable resistance layer 1473.

In an implementation, the fourth variable resistance layer 1474 may include a quinary component, e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, GeSbSeZnSn, CGeSbTeS, CBiSbTeSe, CAgInSbTe, CGeSbSeTe, CGeSnSbTe, CSiGeSbTe, CSiGeSbSe, CSiGeSeTe, CBiGeSeTe, CBiSiGeSe, CBiSiGeTe, CGeSbTeBi, CGeSbSeBi, CGeSbSeIn, CGeSbSeGa, CGeSbSeAl, CGeSbSeTl, CGeSbSeSn, CGeSbSeZn, CGeSbTeIn, CGeSbTeGa, CGeSbTeAl, CGeSbTeTl, CGeSbTeSn, CGeSbTeZn, CScGeSbTe, CScGeSbSe, CScGeSbS, CYGeSbTe, CYGeSbSe, CYGeSbS, CCeGeSbTe, CCeGeSbSe, CCeGeSbS, CDyGeSbTe, CDyGeSbSe, CDyGeSbS, CNdGeSbTe, CNdGeSbSe, or CNdGeSbS.

In an implementation, the variable resistor 147 may further include a fifth variable resistance layer 1475. In an implementation, the fifth variable resistance layer 1475 may be between the fourth variable resistance layer 1474 and the third variable resistance layer 1473.

The fifth variable resistance layer 1475 may include, e.g., a senary component like the first variable resistance layer 1471. In an implementation, the fifth variable resistance layer 1475 may include a senary component represented by $C_h Ge_i Sb_j Te_k A'_m X'_n$. In an implementation, A' and X' may each be, e.g., a group 13 element different from each other and $1 \leq h \leq 18$, $13 \leq i \leq 26$, $15 \leq j \leq 30$, $35 \leq k \leq 55$, $0.1 \leq m \leq 8$, $0.1 \leq n \leq 8$, and $h+i+j+k+m+n=100$.

In an implementation, each of A' and X' may include B, Al, Ga, In, or Tl. In an implementation, A' may include In and X' may include B, Al, Ga, or Tl. In an implementation, A' may include Ga and X' may include B, Al, In, or Tl. In an implementation, A' may include B and X' may include Al, Ga, In, or Tl. In an implementation, A' may include In and X' may include Al.

In an implementation, h may have an arbitrary at % range defined by a starting point and an end point selected from 1, 2, 3, 4, 5, 6, 7, 8, 9, 10, 12, 13, 14, 14, 15, 16, 17, and 18. i may have an arbitrary at % range defined by a starting point and an end point selected from 13, 14, 15, 16, 17, 18, 19, 20, 21, 22, 23, 24, 25, and 26. j may have an arbitrary at % range defined by a starting point and an end point selected from 15, 16, 17, 18, 19, 20, 21, 22, 23, 24, 25, 26, 27, 28, 29, and 30. k may have an arbitrary at % range defined by a starting point and an end point selected from 35, 36, 37, 38, 39, 40, 41, 42, 43, 44, 45, 46, 47, 48, 49, 50, 51, 52, 53, 54, and 55.

Each of m and n may have an arbitrary at % range defined by a starting point and an end point selected from 0.1, 0.2, 0.3, 0.4, 0.5, 0.6, 0.7, 0.8, 0.9, 1, 1.5, 2, 2.5, 3, 3.5, 4, 4.5, 5, 5.5, 6, 6.5, 7, 7.5, and 8. In an implementation, n may have a range of $0.4 \leq n \leq 8$, $0.5 \leq n \leq 8$, $0.6 \leq n \leq 7.5$, $0.7 \leq n \leq 7$, $0.8 \leq n \leq 6.5$, $1 \leq n \leq 6$, $1.5 \leq n \leq 5$, or $2 \leq n \leq 4$. In an implementation, m may have a range of $0.4 \leq m \leq 8$, $0.5 \leq m \leq 8$, $0.6 \leq m \leq 7.5$, $0.7 \leq m \leq 7$, $0.8 \leq m \leq 6.5$, $1 \leq m \leq 6$, $1.5 \leq m \leq 5$, or $2 \leq m \leq 4$.

In an implementation, X of the first variable resistance layer 1471 and X' of the fifth variable resistance layer 1475 may include group 13 elements different from each other. In an implementation, X of the first variable resistance layer 1471 and X' of the fifth variable resistance layer 1475 may include the same group 13 element, and f and n may be different from each other.

When the first to fifth variable resistance layers 1471 to 1475 are configured as illustrated in FIG. 6C, ΔVth may be greater than in the variable resistor illustrated in FIG. 6B.

Figure 7:
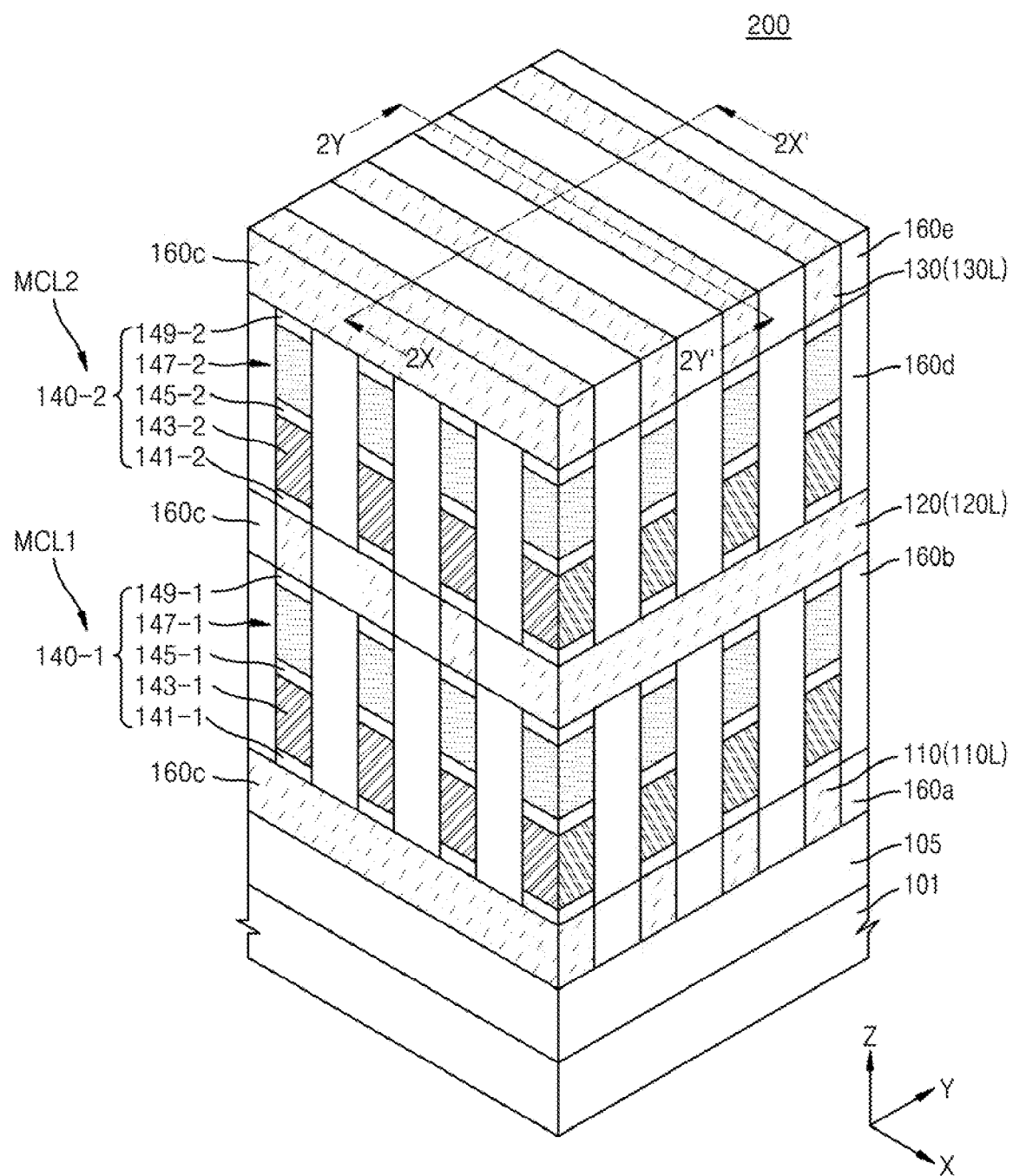
FIG. 7 is a perspective view illustrating a variable resistance memory device according to an embodiment.
Figure 8:
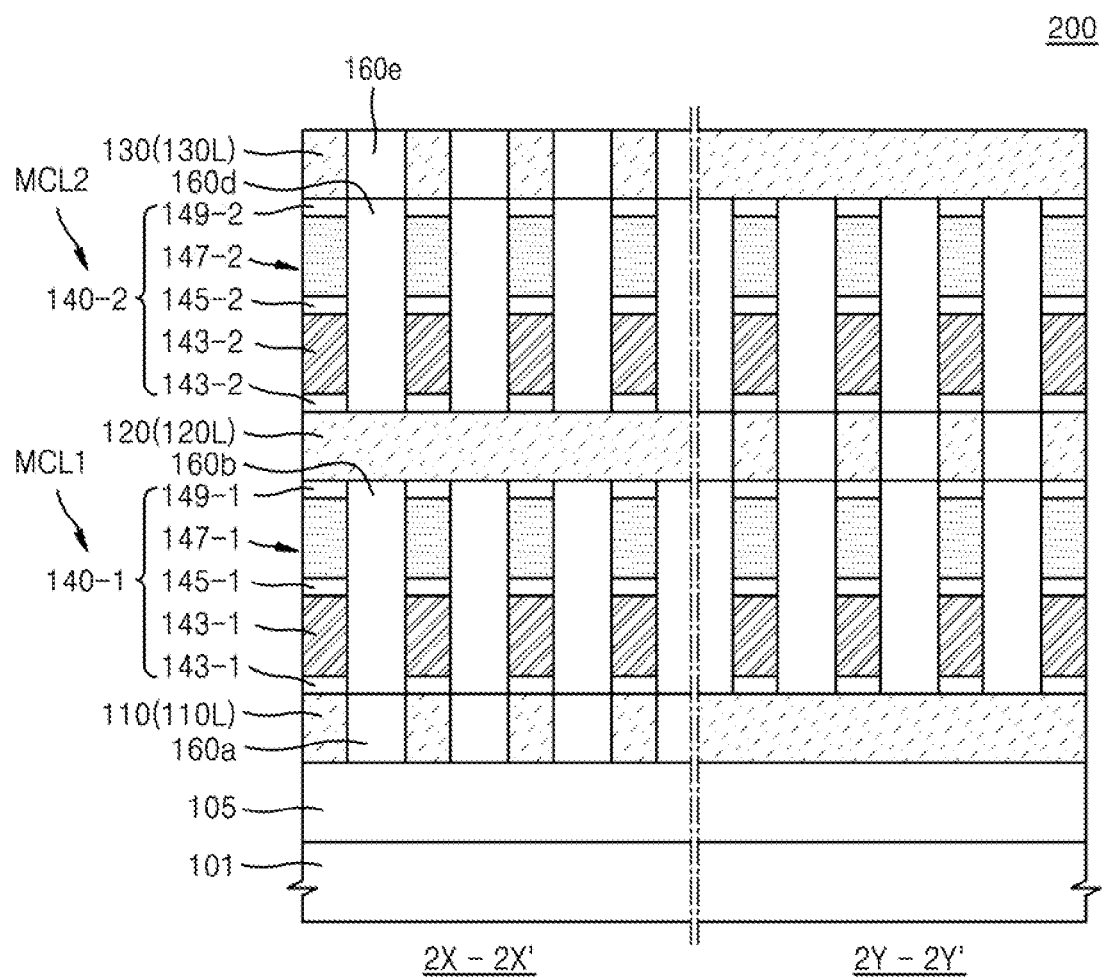
FIG. 8 is a cross-sectional view taken along the lines 2X-2X' and 2Y-2Y' of FIG. 7.

FIG. 7 is a perspective view illustrating a variable resistance memory device 200 according to an embodiment and FIG. 8 is a cross-sectional view taken along the lines 2X-2X' and 2Y-2Y' of FIG. 7.

Most components of the variable resistance memory device 200 and materials of the components, which are described hereinafter, are substantially the same as or similar to most components of the variable resistance memory device 100 and materials of the components thereof, which are described with reference to FIGS. 1 to 6C. Therefore, for convenience sake, a difference between the variable resistance memory device 100 described above and the variable resistance memory device 200 will be mainly described.

Referring to FIGS. 7 and 8, the variable resistance memory device 200 may include a first conductive line layer 110L, a second conductive line layer 120L, a third conductive line layer 130L, a first memory cell layer MCL1, and a second memory cell layer MCL2 on a substrate 101.

As illustrated in FIGS. 7 and 8, an interlayer insulating layer 105 may be on the substrate 101. The first conductive line layer 110L may include a plurality of first conductive lines 110 extending in parallel in a first horizontal direction (an X direction). The second conductive line layer 120L may include a plurality of second conductive lines 120 extending in parallel in a second horizontal direction (a Y direction) perpendicular to the first horizontal direction (the X direction). In an implementation, the third conductive line layer 130L may include a plurality of third conductive lines 130 extending in parallel in the first horizontal direction (the X direction). In an implementation, only a difference between each of the plurality of first conductive lines 110 and each of the plurality of third conductive lines 130 lies in a position in a vertical direction (a Z direction) and each of the plurality of third conductive lines 130 may be substantially the same as each of the plurality of first conductive lines 110 in an extension direction or an arrangement structure.

In driving the variable resistance memory device 200, the plurality of first conductive lines 110 and the plurality of third conductive lines 130 may respectively correspond to the word lines WL (refer to FIG. 1) and the plurality of second conductive lines 120 may respectively correspond to the bit lines BL (refer to FIG. 1). On the contrary, the plurality of first conductive lines 110 and the plurality of third conductive lines 130 may respectively correspond to the bit lines BL (refer to FIG. 1) and the plurality of second conductive lines 120 may respectively correspond to the word lines WL (refer to FIG. 1). When the plurality of first conductive lines 110 and the plurality of third conductive lines 130 correspond to the word lines WL (refer to FIG. 1), the plurality of first conductive lines 110 may respectively correspond to lower word lines, the plurality of third conductive lines 130 may respectively correspond to upper word lines, and the plurality of second conductive lines 120 may respectively correspond to common bit lines because the plurality of second conductive lines 120 are shared by the lower word lines and the upper word lines.

Each of the plurality of first conductive lines 110, the plurality of second conductive lines 120, and the plurality of third conductive lines 130 may include a metal, conductive metal nitride, conductive metal oxide, or a combination of the above metals. In an implementation, each of the plurality of first conductive lines 110, the plurality of second conductive lines 120, and the plurality of third conductive lines 130 may include a metal layer and a conductive barrier layer covering at least a part of the metal layer.

The first memory cell layer MCL1 may include a plurality of first memory cells 140-1 apart from one another in the first horizontal direction (the X direction) and in the second horizontal direction (the Y direction). The second memory cell layer MCL2 may include a plurality of second memory cells 140-2 apart from one another in the first horizontal direction (the X direction) and in the second horizontal direction (the Y direction). As illustrated in FIGS. 7 and 8, the plurality of first conductive lines 110 may intersect with the plurality of second conductive lines 120 and the plurality of second conductive lines 120 may intersect with the plurality of third conductive lines 130. The plurality of first memory cells 140-1 may be at intersections between the plurality of first conductive lines 110 and the plurality of second conductive lines 120 between the first conductive line layer 110L and the second conductive line layer 120L. The plurality of second memory cells 140-2 may be at intersections between the plurality of second conductive lines 120 and the plurality of third conductive lines 130 between the second conductive line layer 120L and the third conductive line layer 130L.

Each of the plurality of first memory cells 140-1 and the plurality of second memory cells 140-2 may include lower electrode layers 141-1 and 141-2, selection element layers 143-1 and 143-2, intermediate electrode layers 145-1 and 145-2, variable resistance layers 147-1 and 147-2, and upper electrode layers 149-1 and 149-2. A structure of each of the plurality of first memory cells 140-1 may be substantially the same as that of each of the plurality of second memory cells 140-2.

The first insulating layer 160a may be between the plurality of first conductive lines 110, and the second insulating layer 160b may be between the plurality of first memory cells 140-1 of the first memory cell layer MCL1. In an implementation, a third insulating layer 160c may be between the plurality of second conductive lines 120, a fourth insulating layer 160d may be between the plurality of second memory cells 140-2 of the second memory cell layer MCL2, and a fifth insulating layer 160e may be arranged among the plurality of third conductive lines 130. The first to fifth insulating layers 160a to 160e may include the same material or at least one of the first to fifth insulating layers 160a to 160e may include a different material. Each of the first to fifth insulating layers 160a to 160e may include, e.g., a dielectric material of oxide or nitride and may electrically isolate elements of each layer from one another. In an implementation, an air gap may be formed instead of at least one of the second insulating layer 160b and the fourth insulating layer 160d. When the air gap is formed, an insulating liner having a predetermined thickness may be between the air gap and each of the plurality of first memory cells 140-1 or between the air gap and each of the plurality of second memory cells 140-2.

The variable resistance memory device 200 according to the current embodiment may have a structure in which the variable resistance memory device 100 described with reference to FIGS. 4 and 5 is repeatedly stacked.

Figure 9:
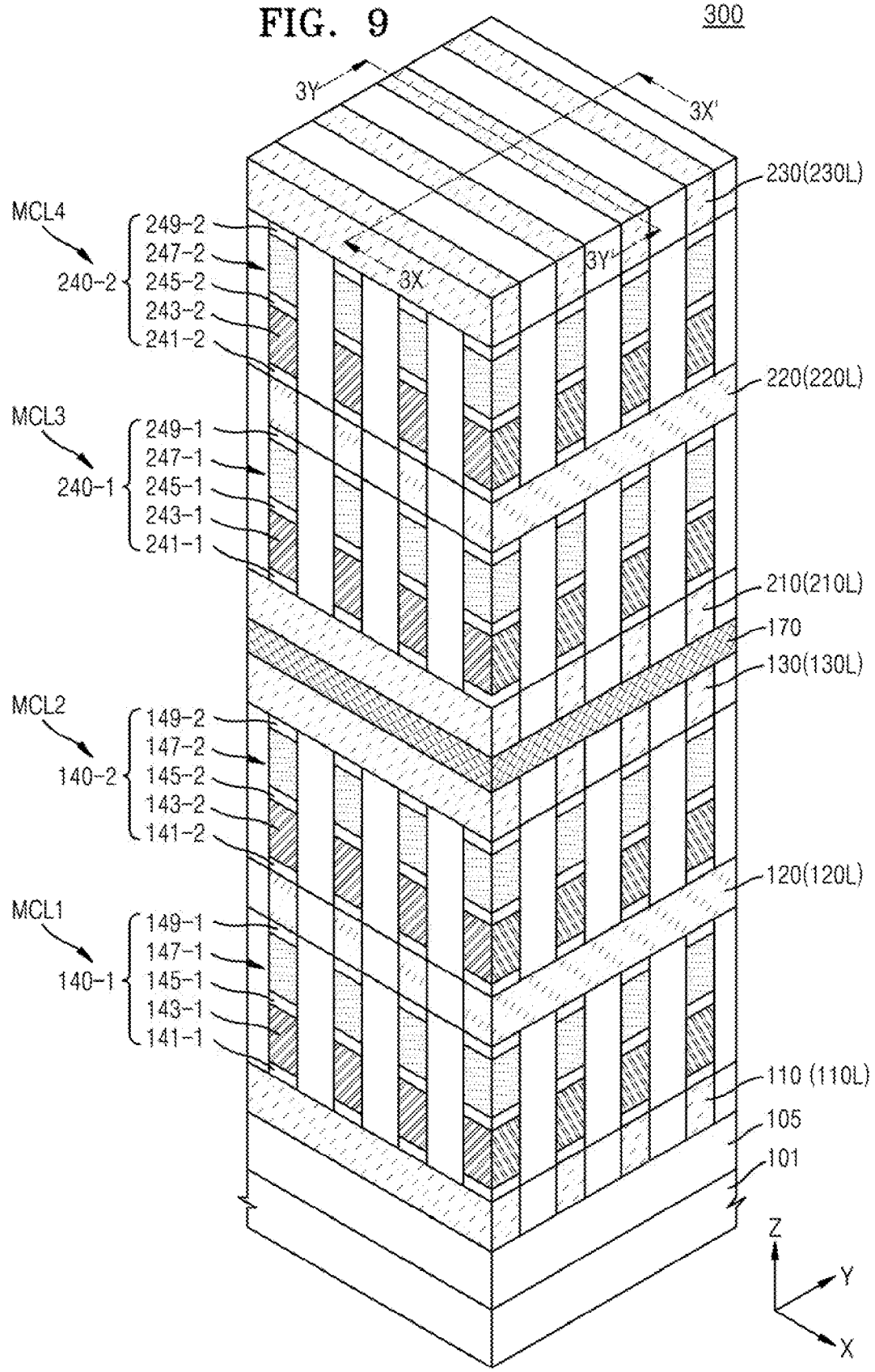
FIG. 9 is a perspective view illustrating a variable resistance memory device according to an embodiment.
Figure 10:
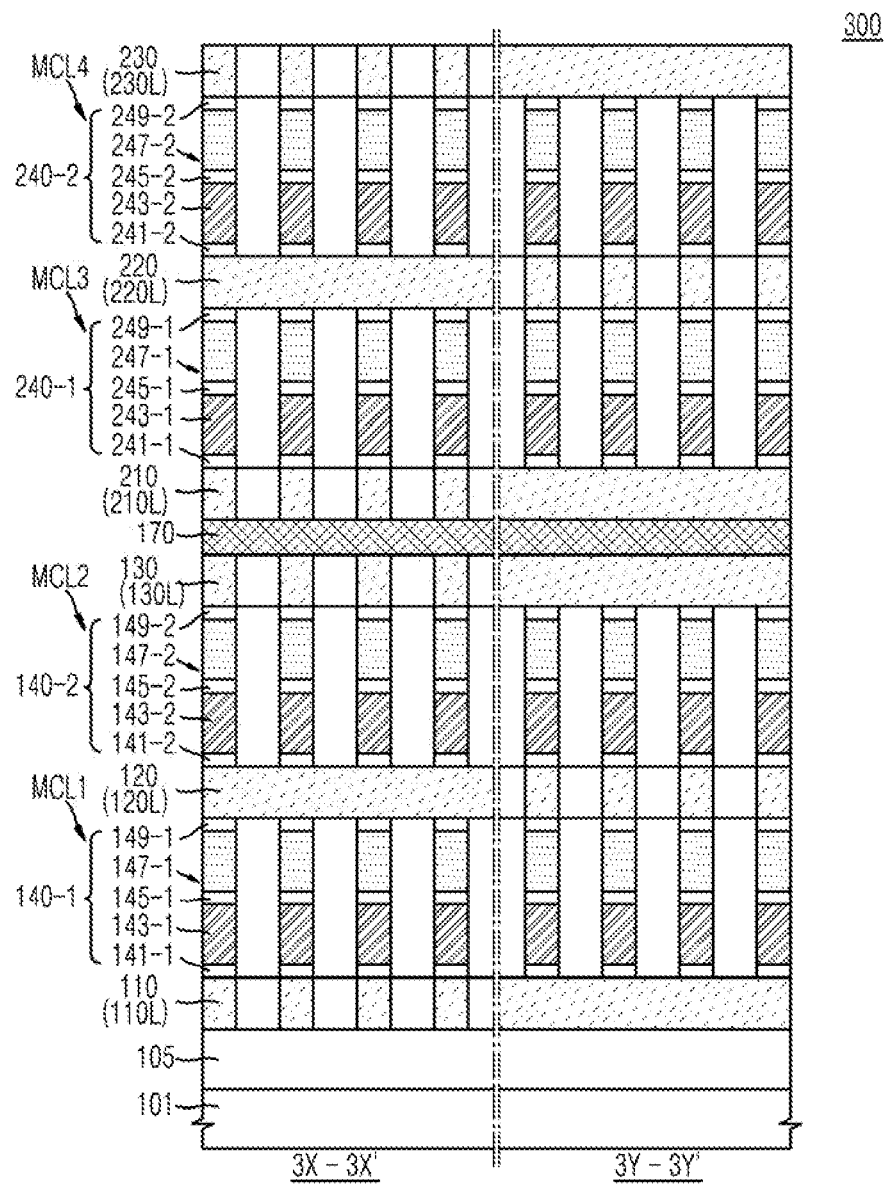
FIG. 10 is a cross-sectional view taken along the lines 3X-3X' and 3Y-3Y' of FIG. 9.

FIG. 9 is a perspective view illustrating a variable resistance memory device 300 according to an embodiment and FIG. 10 is a cross-sectional view taken along the lines 3X-3X' and 3Y-3Y' of FIG. 9.

Most components of the variable resistance memory device 300 and materials of the components, which are described hereinafter, are substantially the same as or similar to most components of the variable resistance memory devices 100 and 200 and materials of the components thereof, which are described with reference to FIGS. 1 to 8. Therefore, for convenience sake, a difference between the variable resistance memory devices 100 and 200 described above and the variable resistance memory device 300 will be mainly described.

Referring to FIGS. 9 and 10, the variable resistance memory device 300 according to the current embodiment may have a four-layer structure including four stacked memory cell layers MCL1, MCL2, MCL3, and MCL4.

In an implementation, the first memory cell layer MCL1 may be between a first conductive line layer 110L and a second conductive line layer 120L and the second memory cell layer MCL2 may be between the second conductive line layer 120L and a third conductive line layer 130L. A second interlayer insulating layer 170 may be on the third conductive line layer 130L and a first upper conductive line layer 210L, a second upper conductive line layer 220L, and a third upper conductive line layer 230L may be on the second interlayer insulating layer 170. The first upper conductive line layer 210L may include a plurality of first upper conductive lines 210 each having the same structure as that of each of the plurality of first conductive lines 110, the second upper conductive line layer 220L may include a plurality of second upper conductive lines 220 each having the same structure as that of each of the plurality of second conductive lines 120, and the third upper conductive line layer 230L may include a plurality of third upper conductive lines 230 each having the same structure as that of each of the plurality of third conductive lines 130 or each of the plurality of first conductive lines 110. The first upper memory cell layer MCL3 may be between the first upper conductive line layer 210L and the second upper conductive line layer 220L, and the second upper memory cell layer MCL4 may be between the second upper conductive line layer 220L and the third upper conductive line layer 230L.

The first to third conductive line layers 110L to 130L and the first and second memory cell layers MCL1 and MCL2 are the same as described above with reference to FIGS. 1 to 8. In an implementation, the first to third upper conductive line layers 210L to 230L and the first and second upper memory cell layers MCL3 and MCL4 may be substantially the same as the first to third conductive line layers 110L to 130L and the first and second memory cell layers MCL1 and MCL2 excluding that the first to third upper conductive line layers 210L to 230L and the first and second upper memory cell layers MCL3 and MCL4 are arranged on the second interlayer insulating layer 170 instead of the first interlayer insulating layer 105.

The variable resistance memory device 300 according to the current embodiment may have a structure in which the variable resistance memory device 100 described with reference to FIGS. 4 and 5 is repeatedly stacked.

Figure 11A:
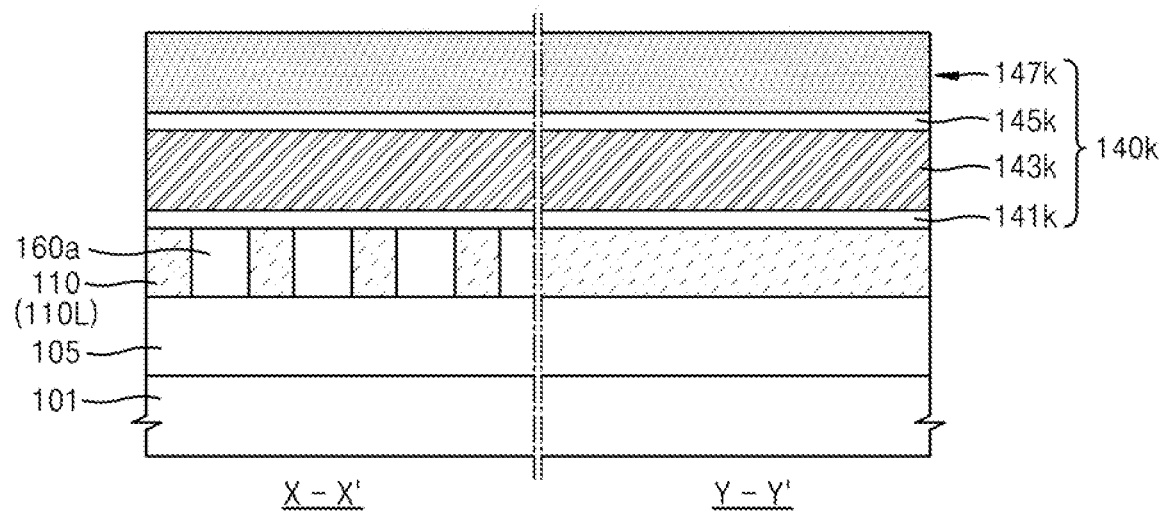
FIGS. 11A and 11B are cross-sectional views illustrating stages in a manufacturing processes of a variable resistance memory device according to an embodiment.
Figure 11B:
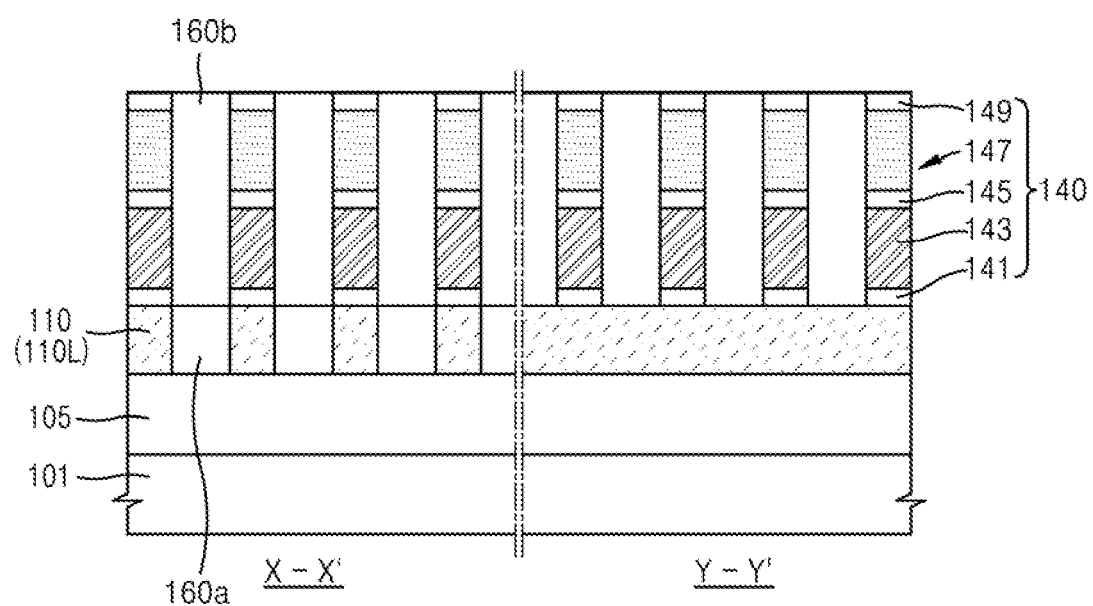

FIGS. 11A and 11B are cross-sectional views illustrating manufacturing processes of a variable resistance memory device according to an embodiment.

Referring to FIG. 11A, the interlayer insulating layer 105 may be formed on the substrate 101. The interlayer insulating layer 105 may include, e.g., silicon oxide or silicon nitride. The first conductive line layer 110L including the plurality of first conductive lines 110 extending in the first horizontal direction (the X direction) and apart from one another may be formed on the interlayer insulating layer 105. Each of the plurality of first conductive lines 110 may be formed by an embossed etching process or a damascene process. The first insulating layer 160a extending in the first horizontal direction (the X direction) may be between the plurality of first conductive lines 110.

A stacked structure 140k may be formed by sequentially stacking a lower electrode material layer 141k, a selection element material layer 143k, an intermediate electrode material layer 145k, and a variable resistance material layer 147k on the first conductive line layer 110L and the first insulating layer 160a.

In an implementation, the variable resistance material layer 147K may include a variable resistance layer of the same composition as that of the first variable resistance layer described above. In an implementation, the variable resistance material layer 147k may include a plurality of variable resistance material layers having different compositions. In this case, the plurality of variable resistance material layers may be arranged so that the stacked structures illustrated in FIGS. 6A to 6C may be obtained when the plurality of variable resistance material layers are etched.

In an implementation, the variable resistance material layer 147k may include a variable resistance material layer including a senary component represented by $C_aGe_bSb_cTe_dA_eX_f$.

In an implementation, the variable resistance material layer 147k may be formed by physical vapor deposition (PVD) such as sputtering. In an implementation, the variable resistance material layer 147k may be formed by the chemical vapor deposition (CVD) or atomic layer deposition (ALD).

Referring to FIG. 11B, after performing the etching process of the variable resistance material layer 147k, mask patterns apart from one another in the first horizontal direction (the X direction) and in the second horizontal direction (the Y direction) may be formed on the stacked structure 140k. The plurality of memory cells 140 may be formed by etching the stacked structure 140k so that parts of top surfaces of the first insulating layer 160a and the plurality of first conductive lines 110 are exposed by using the mask patterns.

Next, the second insulating layer 160b filling spaces between the plurality of memory cells 140 may be formed. The second insulating layer 160b may include the same silicon oxide or silicon nitride as the first insulating layer 160a, or a different silicon oxide or silicon nitride from the silicon oxide or silicon nitride. The second insulating layer 160b may be formed by forming an insulating material layer to a thickness sufficient to completely fill the spaces between the plurality of memory cells 140 and planarizing the insulating material layer by a chemical mechanical polishing (CMP) process so that a top surface of the upper electrode layer 149 is exposed.

Next, by forming a conductive layer for the second conductive line layer and patterning the conductive layer by etching, the plurality of second conductive lines 120 may be formed so that the variable resistance memory device 100 illustrated in FIG. 5 may be manufactured. The plurality of second conductive lines 120 may extend in the second horizontal direction (the Y direction) and may be apart from one another. The third insulating layer 160c extending in the second horizontal direction (the Y direction) may be between the plurality of second conductive lines 120.

The variable resistance memory device 100 according to an embodiment, which is manufactured by the above process, may have a large ΔVth so that the reset state may be more clearly distinguished from the set state.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Variable resistance layers were prepared so that components other than Ge, Sb, and Te had the respective compositions illustrated in the following TABLE 1. Contents of Ge, Sb, and Te as remainders of the components of the TABLE 1 were controlled so that Ge, Sb, and Te had an atomic ratio of 2:2:5. Then, ΔVth of each of Ge, Sb, and Te is illustrated in the TABLE 1 in an arbitrary unit (au.). In addition, ΔVth of Comparative Examples 1 to 4 and Examples 1 and 2 is illustrated in a chart in FIG. 12.

TABLE 1

|  | ΔVth (a.u.) | C (at %) | In (at %) | Al (at %) | B (at %) | Ga (at %) | Tl (at %) |
|---|---|---|---|---|---|---|---|
| Comparative Example 1 | 0.8 | 0 | 0 | 0 | 0 | 0 | 0 |
| Comparative Example 2 | 1.15 | 8.9 | 0 | 0 | 0 | 0 | 0 |
| Comparative Example 3 | 1.2 | 12.1 | 0 | 0 | 0 | 0 | 0 |
| Comparative Example 4 | 1.275 | 11.7 | 3 | 0 | 0 | 0 | 0 |
| Comparative Example 5 | 1.25 | 11.5 | 5 | 0 | 0 | 0 | 0 |
| Comparative Example 6 | 1.175 | 12.3 | 1 | 0 | 0 | 0 | 0 |
| Comparative Example 7 | 1.1 | 18.8 | 0 | 0 | 0 | 0 | 0 |
| Comparative Example 8 | 0.85 | 0 | 0 | 0 | 0 | 0 | 0 |
| Example 1 | 1.3 | 11.3 | 3 | 5 | 0 | 0 | 0 |
| Example 2 | 1.35 | 11.7 | 3 | 3 | 0 | 0 | 0 |
| Example 3 | 1.33 | 11.5 | 3 | 0 | 5 | 0 | 0 |
| Example 4 | 1.345 | 11.7 | 3 | 0 | 3 | 0 | 0 |
| Example 5 | 1.31 | 11.5 | 3 | 0 | 0 | 5 | 0 |
| Example 6 | 1.335 | 11.7 | 3 | 0 | 0 | 3 | 0 |
| Example 7 | 1.29 | 11.5 | 3 | 0 | 0 | 0 | 5 |
| Example 8 | 1.335 | 11.7 | 3 | 0 | 0 | 0 | 3 |

Figure 12:
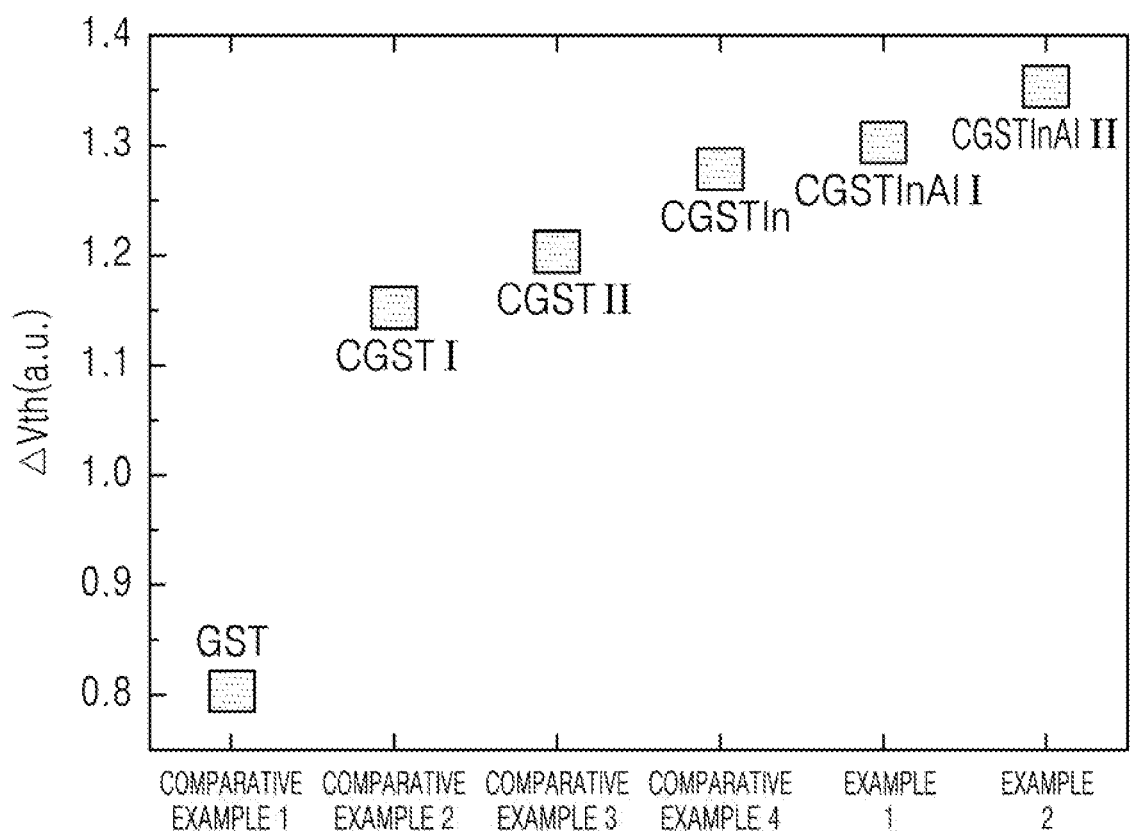
FIG. 12 is a chart illustrating a result of measuring $\Delta Vth$ of Comparative Examples 1 to 4 and Examples 1 and 2.

Referring to TABLE 1 and FIG. 12, it may be seen that the variable resistor having the senary component represented by $C_aGe_bSb_cTe_dA_eX_f$ described with reference to FIG. 4 obtained greater ΔVth than variable resistors having ternary to quinary components. In particular, it may be seen that a large ΔVth was obtained when In was used as A and Al, B, Ga, or Ti was used as X. It may be seen that the largest ΔVth was obtained when Al at 3 at % is used.

By way of summation and review, a voltage margin capable of distinguishing states of information items of the variable resistance memory device from one another may be expanded.

One or more embodiments may provide a variable resistance memory device having high thermal stability and capable of clearly distinguishing a reset state from a set state.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a first conductive line extending on a substrate in a first horizontal direction;
a second conductive line extending on the first conductive line in a second horizontal direction perpendicular to the first horizontal direction; and
a memory cell at an intersection between the first conductive line and the second conductive line, the memory cell including a selection element and a variable resistor, wherein the variable resistor includes a first variable resistance layer having a senary component represented by $C_a Ge_b Sb_c Te_d A_e X_f$, in which A and X are each a group 13 element different from each other, and $1 \leq a \leq 18$, $13 \leq b \leq 26$, $15 \leq c \leq 30$, $35 \leq d \leq 55$, $0.1 \leq e \leq 8$, $0.1 \leq f \leq 8$, and $a+b+c+d+e+f=100$.

2. The variable resistance memory device as claimed in claim 1, wherein:
A includes indium (In), and
X includes boron (B), aluminum (Al), gallium (Ga), or thallium (Tl).

3. The variable resistance memory device as claimed in claim 2, wherein X of the first variable resistance layer includes Al.

4. The variable resistance memory device as claimed in claim 2, wherein $1 \leq f \leq 6$.

5. The variable resistance memory device as claimed in claim 4, wherein $2 \leq f \leq 4$.

6. The variable resistance memory device as claimed in claim 1, wherein:
A includes Ga, and
X includes B, Al, In, or Tl.

7. The variable resistance memory device as claimed in claim 1, wherein:
A includes B, and
X includes Al, Ga, In, or Tl.

8. The variable resistance memory device as claimed in claim 1, wherein the memory cell further includes an intermediate electrode between the selection element and the variable resistor.

9. The variable resistance memory device as claimed in claim 1, wherein:
the variable resistor further includes a second variable resistance layer on the first variable resistance layer, and
the second variable resistance layer includes GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, NdSbS, CGeTe, CGeSe, CGeS, CSbSe, CSbTe, CSbS, CSbSe, CSnSb, CInSe, CInSb, CAsTe, CAlTe, CGaSb, CAlSb, CBiSb, CScSb, CYSb, CCeSb, CDySb, or CNdSb.

10. The variable resistance memory device as claimed in claim 1, wherein:
the variable resistor further includes a third variable resistance layer on the first variable resistance layer, and
the third variable resistance layer includes CGeSbSe, CAlSbTe, CAlSbSe, CSiSbSe, CSiSbTe, CGeSeTe, CInGeTe, CGeSbTe, CGeAsTe, CSnSeTe, CGeGaSe, CBiSbSe, CGaSeTe, CInGeSb, CGaSbSe, CGaSbTe, CInSbSe, CInSbTe, CSnSbSe, CSnSbTe, CScSbTe, CScSbSe, CScSbS, CYSbTe, CYSbSe, CYSbS, CCeSbTe, CCeSbSe, CCeSbS, CDySbTe, CDySbSe, CDySbS, CNdSbTe, CNdSbSe, CNdSbS, GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS.

11. The variable resistance memory device as claimed in claim 1, wherein:
the variable resistor further includes a fourth variable resistance layer on the first variable resistance layer, and
the fourth variable resistance layer includes InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, GeSbSeZnSn, CGeSbTeS, CBiSbTeSe, CAgInSbTe, CGeSbSeTe, CGeSnSbTe, CSiGeSbTe, CSiGeSbSe, CSiGeSeTe, CBiGeSeTe, CBiSiGeSe, CBiSiGeTe, CGeSbTeBi, CGeSbSeBi, CGeSbSeIn, CGeSbSeGa, CGeSbSeAl, CGeSbSeTl, CGeSbSeSn, CGeSbSeZn, CGeSbTeIn, CGeSbTeGa, CGeSbTeAl, CGeSbTeTl, CGeSbTeSn, CGeSbTeZn, CScGeSbTe, CScGeSbSe, CScGeSbS, CYGeSbTe, CYGeSbSe, CYGeSbS, CCeGeSbTe, CCeGeSbSe, CCeGeSbS, CDyGeSbTe, CDyGeSbSe, CDyGeSbS, CNdGeSbTe, CNdGeSbSe, or CNdGeSbS.

12. The variable resistance memory device as claimed in claim 1, wherein:
the variable resistor is on the first variable resistance layer, and
the variable resistor includes a fifth variable resistance layer having a senary component represented by $C_h Ge_i Sb_j Te_k A'_m X'_n$, in which A' and X' are each a group 13 element different from each other, and $1 \leq h \leq 18$, $13 \leq i \leq 26$, $15 \leq j \leq 30$, $35 \leq k \leq 55$, $0.1 \leq m \leq 8$, $0.1 \leq n \leq 8$, and $h+i+j+k+m+n=100$.

13. The variable resistance memory device as claimed in claim 12, wherein X of the first variable resistance layer and X' of the fifth variable resistance layer are elements different from each other.

14. The variable resistance memory device as claimed in claim 12, wherein:
X of the first variable resistance layer and X' of the fifth variable resistance layer are the same element, and
f of the first variable resistance layer and n of the fifth variable resistance layer are different from each other.

15. A variable resistance memory device, comprising:
a first conductive line extending on a substrate in a first horizontal direction;
a second conductive line extending on the first conductive line in a second horizontal direction perpendicular to the first horizontal direction; and
a memory cell at an intersection between the first conductive line and the second conductive line, the memory cell including a selection element and a variable resistor,
wherein the variable resistor includes:
a first variable resistance layer having a senary component including carbon, A, and X, in which, A and X are each a group 13 element different from each other, and
a second variable resistance layer on the first variable resistance layer, the second variable resistance layer including a ternary component including germanium (Ge), antimony (Sb), and tellurium (Te).

16. The variable resistance memory device as claimed in claim 15, wherein:
the variable resistor further includes:
a third variable resistance layer on the first variable resistance layer, the third variable resistance layer including a quaternary component including Ge, Sb, and Te; or
a fourth variable resistance layer on the first variable resistance layer, the fourth variable resistance layer including a quinary component including Ge, Sb, and Te, and
the variable resistor has a symmetrical structure centered on the first variable resistance layer.

17. The variable resistance memory device as claimed in claim 16, wherein:
the variable resistor further includes a fifth variable resistance layer on the first variable resistance layer, the fifth variable resistance layer including a senary component including C, A', and X', in which A' and X' are each a group 13 element different from each other, and
the variable resistor has a symmetrical structure centered on the first variable resistance layer.

18. The variable resistance memory device as claimed in claim 15, wherein:
A includes In, and
X includes Al.

19. The variable resistance memory device as claimed in claim 18, wherein a content of X in the senary component is in a range of about 1 at % to about 6 at %.

20. A variable resistance memory device, comprising:
a first conductive line extending on a substrate in a first horizontal direction;
a second conductive line extending on the first conductive line in a second horizontal direction intersecting with the first horizontal direction;
a memory cell at an intersection between the first conductive line and the second conductive line, the memory cell including a selection element and a variable resistor;
a lower electrode contacting a top surface of the first conductive line; and
an upper electrode contacting a bottom surface of the second conductive line,
wherein the variable resistor includes a first variable resistance layer having a senary component represented by $C_a Ge_b Sb_c Te_d A_e X_f$, in which A and X are each a group 13 element different from each other and $1 \leq a \leq 18$, $13 \leq b \leq 26$, $15 \leq c \leq 30$, $35 \leq d \leq 55$, $0.1 \leq e \leq 8$, $0.1 \leq f \leq 8$, and $a+b+c+d+e+f=100$.

* * * * *